United States Patent
Pathrose Vareed et al.

(10) Patent No.: US 12,057,832 B2
(45) Date of Patent: Aug. 6, 2024

(54) SEMICONDUCTOR DEVICE INCLUDING A LEVEL SHIFTER AND METHOD OF MITIGATING A DELAY BETWEEN INPUT AND OUTPUT SIGNALS

(71) Applicant: Taiwan Semiconductor Manufacturing Company, Ltd., Hsinchu (TW)

(72) Inventors: Jerrin Pathrose Vareed, Hsinchu (TW); Shiba Mohanty, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,372

(22) Filed: Aug. 10, 2023

(65) Prior Publication Data

US 2023/0387915 A1 Nov. 30, 2023

Related U.S. Application Data

(62) Division of application No. 17/571,690, filed on Jan. 10, 2022, now Pat. No. 11,764,784.

(60) Provisional application No. 63/219,008, filed on Jul. 7, 2021.

(51) Int. Cl.
H03K 19/0185 (2006.01)
H03K 3/037 (2006.01)

(52) U.S. Cl.
CPC ..... *H03K 19/018521* (2013.01); *H03K 3/037* (2013.01)

(58) Field of Classification Search
CPC .................................................. H03K 19/0185
See application file for complete search history.

(56) References Cited

U.S. PATENT DOCUMENTS

| | | | |
|---|---|---|---|
| 11,764,784 B2 * | 9/2023 | Pathrose Vareed .... | H03K 3/037 327/333 |
| 2010/0231259 A1 | 9/2010 | Jung et al. | |
| 2017/0288673 A1 | 10/2017 | Nadkarni et al. | |
| 2018/0278252 A1 | 9/2018 | Wu et al. | |

OTHER PUBLICATIONS

Taiwan Office Action, Application No. 111115724, Dated Apr. 17, 2023.

* cited by examiner

*Primary Examiner* — Patrick O Neill
(74) *Attorney, Agent, or Firm* — Jones Day

(57) ABSTRACT

A semiconductor device includes an input, a level shifter, an output, and a switch module. The input is configured to receive an input signal in a first voltage domain. The level shifter is connected to the input and is configured to shift the input signal from the first voltage domain to a second voltage domain. The switch module is configured to connect one of the input and the level shifter to the output. A method of mitigating a delay between input and output signals of the semiconductor device is also disclosed.

20 Claims, 7 Drawing Sheets

S2/S3

US 12,057,832 B2

SEMICONDUCTOR DEVICE INCLUDING A LEVEL SHIFTER AND METHOD OF MITIGATING A DELAY BETWEEN INPUT AND OUTPUT SIGNALS

PRIORITY CLAIM

This application is a divisional of U.S. patent application Ser. No. 17/571,690, filed Jan. 10, 2022, which claims priority to U.S. Provisional Application No. 63/219,008, filed Jul. 7, 2021, the contents of each of which are incorporated herein by reference in their entirety.

BACKGROUND

A level shifter may be used in a variety of semiconductor devices to receive an input signal in a first voltage domain and to output an output signal in a second voltage domain. The first voltage domain may be higher or lower than the second voltage domain. Such a level shifter is utilized in a circuit of a semiconductor device between portions of the circuit that have different voltage requirements. That is, a lower voltage is provided to operate portions of the circuit capable of operating in a lower voltage domain and a higher voltage is provided to operate portions of the circuit capable of operating in a higher voltage domain.

BRIEF DESCRIPTION OF THE DRAWINGS

Aspects of the present disclosure are best understood from the following detailed description when read with the accompanying figures.

DETAILED DESCRIPTION

Figure 1:
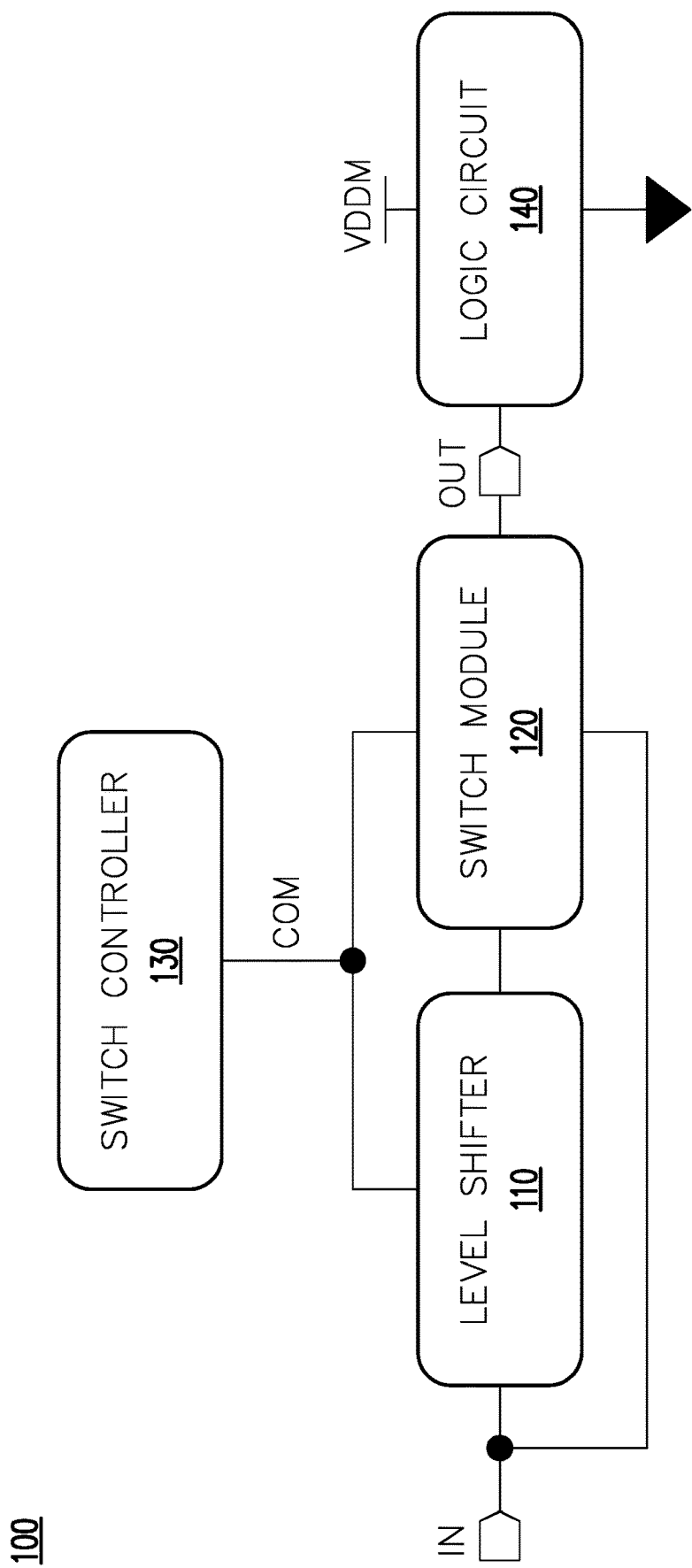
FIG. 1 is a schematic block diagram illustrating an exemplary semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A level shifter may be used in a variety of semiconductor devices to receive a first input signal in a first voltage domain and to output a second output signal in a second voltage domain. The first voltage domain may be higher or lower than the second voltage domain. Such a level shifter is utilized in a circuit of a semiconductor device between portions of the circuit that have different voltage requirements. That is, a lower voltage is provided to operate portions of the circuit capable of operating in a lower voltage domain and a higher voltage is provided to operate portions of the circuit capable of operating in a higher voltage domain.

Level shifters are susceptible to certain limitations. For example, there is a delay associated with level shifters due to the number of transistors an input signal traverses before reaching an output. During a level shifting operation of a level shifter, a rising edge of an output signal may lag a rising edge of an input signal. Such a delay may also be due to the level shifter operating in a voltage domain lower than a voltage domain of the input signal, which results in low gate-source voltages of transistors during the level shifting operation. Further, level shifters may experience static current during a level shifting operation, which increases power consumption thereof.

Systems and methods as describe herein include a semiconductor device, e.g., semiconductor device 100, 400, 600 of FIG. 1, 4, 6 in accordance with various embodiments of the present disclosure, that mitigates a delay between input and output signals. For example, the semiconductor device 100, 400, 600 includes a level shifter, e.g., level shifter 110, 410, 610, and a switch module, e.g., switch module 120, 420, 620. The level shifter 110, 410, 610 is connected between an input, e.g., input (IN), and an output, e.g., output (OUT). The input (IN) receives an input signal in a first voltage domain. The level shifter 110, 410, 610 shifts the input signal from the first voltage domain to a second voltage domain when the first voltage domain is lower than the second voltage domain. As will be described in more detail below, the output (OUT) is made to operate in the first voltage domain using the switch module 120, 420, 620 when the first voltage domain is higher than the second voltage domain, resulting in a less delay between the input and output signals.

FIG. 1 is a schematic block diagram illustrating an exemplary semiconductor device 100 in accordance with some embodiments of the present disclosure. As illustrated in FIG. 1, the semiconductor device 100 includes a level shifter 110, a switch module 120, a switch controller 130, and a logic circuit 140. The level shifter 110 and the switch module 120 are connected between an input (IN) and an output (OUT) of the semiconductor device 100. The input (IN) is configured to receive an input signal in a first voltage domain. The first voltage domain transitions between a high logic level, which corresponds to a first voltage, e.g., VDD Volts, and a low logic level, e.g., 0 Volt.

The level shifter 110 is configured to shift the input signal from the first voltage (VDD) domain to a second voltage domain. The second voltage domain transitions between a high logic level, which corresponds to a second voltage, e.g., VDDM Volts, and a low logic level, e.g., 0 Volt. The first voltage (VDD) may be higher or lower than the second voltage (VDDM).

The switch controller 130 is configured to receive the voltages (VDD, VDDM) and to determine whether the voltage (VDD) is lower or higher than the voltage (VDDM). When it is determined that the voltage (VDD) is lower than the voltage (VDDM), i.e., VDD<VDDM, the switch controller 130 generates a control signal (COM) that has a low logic level, otherwise, i.e., it is determined that VDD>VDDM, the switch controller 130 generates a control signal (COM) that has a high logic level. Such a correspondence may be reversed in some embodiments. For example, when it is determined that VDD<VDDM, the switch controller 130 generates a control signal (COM) having a high logic level, otherwise, the switch controller 130 generates a control signal (COM) having a low logic level.

In certain embodiments, the switch controller 130 is a portion of a power management circuit of the semiconductor device 100 capable of, for example, managing a power consumption of the semiconductor device 100.

The switch module 120 is responsive to the control signal (COM) for controlling switching activities thereof. For example, when the control signal (COM) is a low logic level, the switch module 120 disconnects the input (IN) from the output (OUT) and connects the level shifter 110 to the output (OUT). In this manner, as will be described below, the output (OUT) outputs an output signal in the second voltage (VDDM) domain. On the other hand, when the control signal (COM) is a high logic level, the switch module 120 disconnects the level shifter 110 from the output (OUT) and connects the input (IN) to the output (OUT). In this manner, the output (OUT) outputs an output signal in the first voltage (VDD) domain.

The logic circuit 140 is connected to the output (OUT) and is configured to operate in the second voltage (VDDM) domain and to invert the output signal one or more times, depending on the system functionality. For example, in some embodiments, the logic circuit 140 inverts the output signal once. In such some embodiments, when the output signal transitions from a low logic level to a high logic level, the logic circuit 140 outputs a low logic level, e.g., 0 Volt, otherwise, i.e., the output signal transitions from a high logic level to a low logic level, the logic circuit 140 outputs a high logic level, e.g., VDDM Volts. In other embodiments, the logic circuit 140 inverts the output signal twice. In such other embodiments, when the output signal transitions from a low logic level to a high logic level, the logic circuit 140 outputs a high logic level, e.g., VDDM Volts, otherwise, the logic circuit 140 outputs a low logic level, e.g., 0 Volt. In an exemplary embodiment, the logic circuit 140 includes a NOT gate, an AND gate, a NAND gate, an OR gate, a NOR gate, an XOR gate, an XNOR gate, any suitable logic gate, or a combination thereof.

In an alternative embodiment, the semiconductor device 100 is dispensed with at least one of the switch controller 130 and the logic circuit 140. In such an alternative embodiment, the at least one of the switch controller 130 and the logic circuit 140 may be connected external to the semiconductor device 100.

Figure 2:
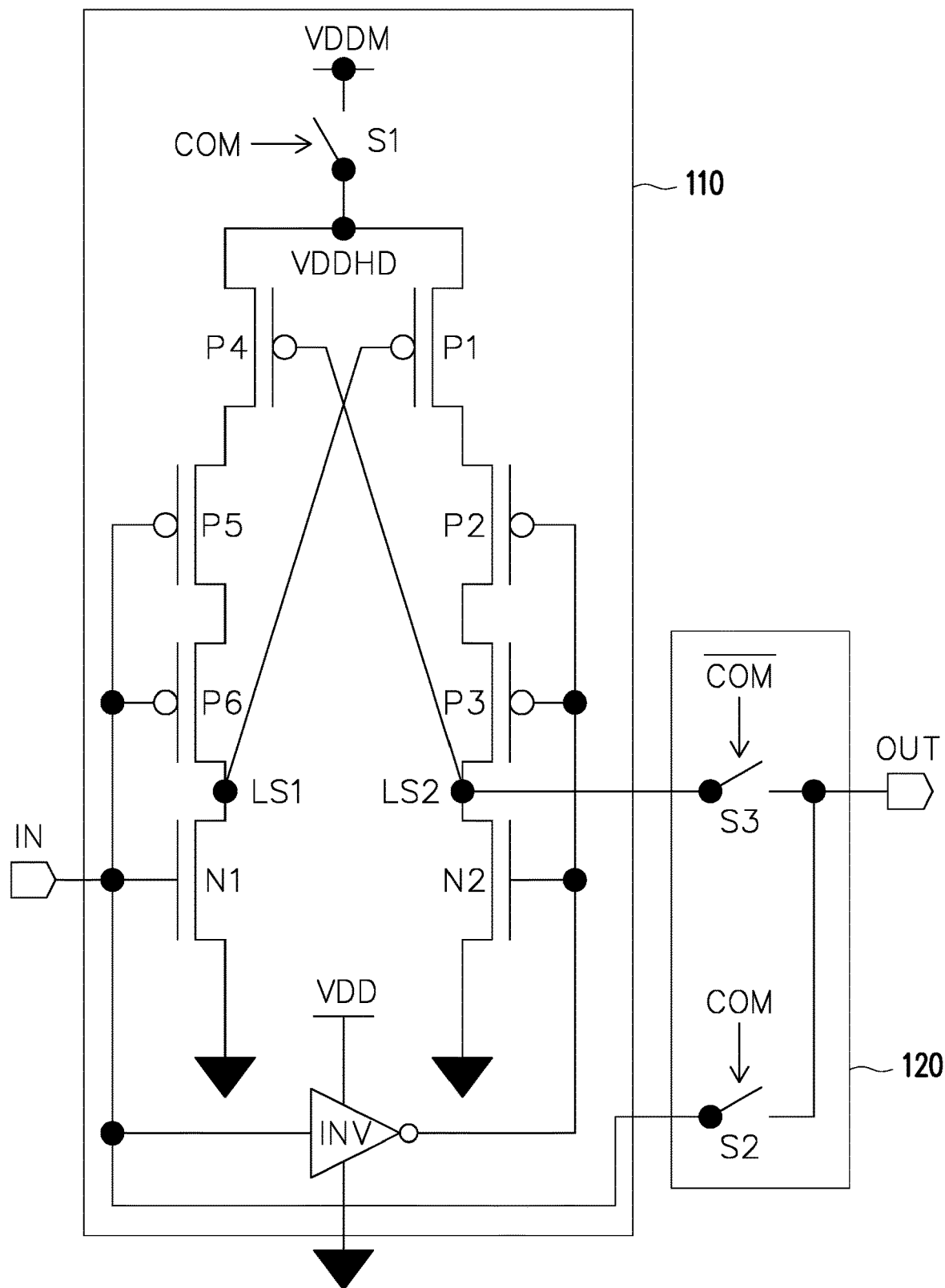
FIG. 2 is a schematic circuit diagram illustrating an exemplary level shifter and an exemplary switch module in accordance with various embodiments of the present disclosure.

Example supporting circuitry for the level shifter 110 and the switch module 120 are depicted in FIG. 2. It is understood that these circuitry are provided by way of example, not by limitation, and other suitable level shifter circuitry and switch module circuitry are within the scope of the present disclosure. FIG. 2 is a schematic circuit diagram illustrating an exemplary level shifter 110 and an exemplary switch module 120 in accordance with various embodiments of the present disclosure. As illustrated in FIG. 2, the level shifter 110 is implemented using complementary metal oxide semiconductor (CMOS) technology, e.g., N type MOS (NMOS) and P type MOS (PMOS) transistors. In operation, CMOS transistors operate like switches. That is, in an ON state, the switch is closed and in an OFF state the switch is open. For NMOS transistors, when a voltage exceeding a threshold voltage (Vth) of the NMOS transistor is applied to a gate thereof, the NMOS transistor turns ON and current passes between a source and a drain thereof, otherwise, the NMOS transistor is OFF and current is prevented from passing between the source and the drain. In the case of a PMOS transistor, when a voltage exceeding the threshold voltage (Vth) of the PMOS transistor is applied to a gate thereof, the PMOS transistor is OFF and current is prevented from passing between a source and a drain thereof, otherwise, the PMOS transistor is ON and current passes between the source and the drain.

As illustrated in FIG. 2, the level shifter 110 includes an inverter (INV) operating in the first voltage (VDD) domain. The level shifter 110 further includes two pull-down NMOS transistors (N1, N2), two cross-coupling PMOS transistors (P1, P4), and stacking PMOS transistors (P2, P3, P5, P6) between the pull-down NMOS transistors (N1, N2) and the cross-coupling PMOS transistors (P1, P4).

The level shifter 110 further includes a switch (S1) that connects selectively a VDDM node, which receives the voltage (VDDM), to the cross-coupling PMOS transistors (P1, P4) thereof. The switch (S1) has a first switch terminal connected to the VDDM node, a second switch terminal connected to the cross-coupling PMOS transistors (P1, P4) of the level shifter 110, and a third switch terminal configured to receive the control signal (COM). In this exemplary embodiment, the switch (S1) is in the form of a PMOS transistor that has a source, a drain, and a gate, each of which serves as a respective one of the first, second, and third switch terminals of the switch (S1). Other configurations for the switch (S1) are used in further embodiments.

The switch module 120 includes switches (S2, S3) responsive to the control signal (COM), in a manner that will be described below. Although not shown, an inverter is connected between the switch controller 130 and the switch (S3). Therefore, when the control signal (COM) at the switch (S2) is at a high/low logic level, a complement of the control signal (COM), i.e., a low/high logic level, is at the switch (S3) and vice versa.

The switch (S2) has a first switch terminal connected to the input (IN), a second switch terminal connected to the output (OUT), and a third switch terminal configured to receive the control signal (COM). The switch (S3) has a first switch terminal connected to a node (LS2) of the level shifter 110, a second switch terminal connected to the output (OUT), and a third switch terminal configured to receive a complement of the control signal (COM).

Figure 3:
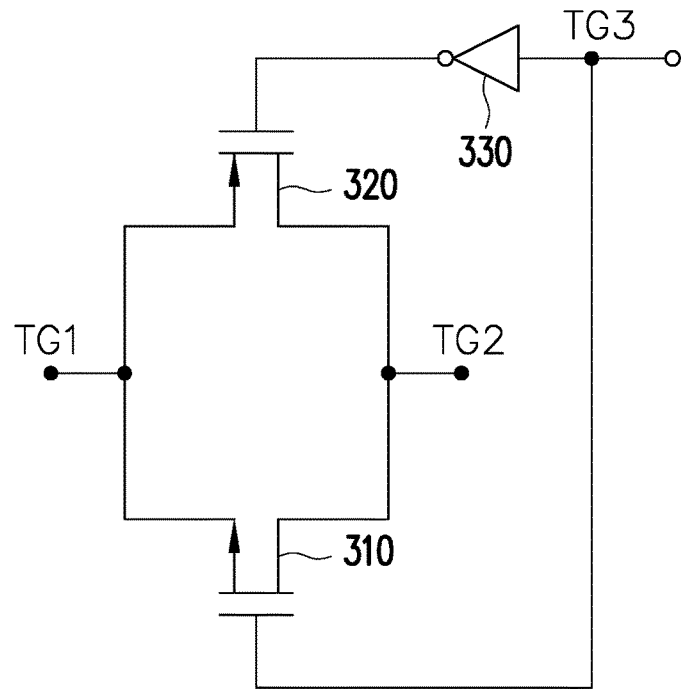
FIG. 3 is a schematic circuit diagram illustrating an exemplary switch of a switch module in accordance with various embodiments of the present disclosure.

In an exemplary embodiment, at least one of the switches (S2, S3) has a configuration shown in FIG. 3. Other configurations for the switch (S2, S3) are used in further embodiments. FIG. 3 is a schematic circuit diagram illustrating an exemplary switch (S2, S3) in accordance with various embodiments of the present disclosure. As illustrated in FIG. 3, the switch (S2, S3) is in the form of a transmission gate and includes an NMOS transistor 310, a PMOS transistor 320 connected in parallel with the NMOS transistor 310, an input node (TG1) that is connected between a source of the NMOS transistor 310 and a source of the PMOS transistor 320 and that serves as the first switch terminal of the switch (S2, S3), and an output node (TG2) that is connected between a drain of the NMOS transistor 310 and a drain of the PMOS transistor 320 and that serves as the second switch terminal of the switch (S1, S2). A control node (TG3), which serves as the third switch terminal of the switch (S1, S2), is connected to a gate of the NMOS transistor 310. An inverter 330 is connected between the control node (TG3) and a gate of the PMOS transistor 320. As such, when a control signal (COM) at the control node (TG3) (i.e., at the third switch terminal of the switch S2, S3) is at a high logic level, both the NMOS and PMOS transistors 310, 320 are turned ON and a low resistance path exists between input and output nodes (TG1, TG2) (i.e., between the first and second switch terminals of the switch S1, S2), otherwise, i.e., a control signal (COM) at the control node (TG3) is at a low logic level, both the NMOS and PMOS transistors 310, 320 are turned OFF and a high resistance path exists between input and output nodes (TG1, TG2).

In operation, the switch controller 130 receives the voltages (VDD,VDDM) and determines whether the voltage (VDD) is lower or higher than the voltage (VDDM). When it is determined that the voltage (VDD) is less than the voltage (VDDM), i.e., VDD<VDDM, the switch controller 130 generates a control signal (COM) that has a low logic level, thereby turning OFF the switch (S2) and, at substantially the same time, turning ON the switches (S1, S3). Consequently, a voltage (VDDHD) at a VDDHD node is substantially equal to the voltage (VDDM). At this time, when the input signal at the input (IN) transitions from a high logic level, i.e., "1", to a low logic level, i.e., "0", the NMOS transistor (N1) remains OFF and the output of the inverter (INV) is a high logic level. The output of the inverter (INV) causes the NMOS transistor N2 to turn ON and as a result, the node (LS2) of the level shifter 110 is pulled down, the output (OUT) is discharged to the ground, and the voltage at the output (OUT) is 0 Volt.

Thereafter, when the input signal transitions from 0 to 1, the NMOS transistor (N1) turns ON and the output of the inverter (INV) is a low logic level. This causes the NMOS transistor (N2) to turn OFF and the PMOS transistors (P1-P3) to turn ON. As a result, the node (LS1) of the level shifter 110 is pulled down and the output (OUT) is charged to the voltage (VDDM) through the PMOS transistors (P1-P3) and the switch (S3).

On the other hand, when it is determined that VDD>VDDM, the switch controller 130 generates a control signal (COM) that has a high logic level, thereby turning ON the switch (S2) and, at substantially the same time, turning OFF the switches (S1, S3). At this time, when the input signal transitions from 1 to 0, the voltage at the output (OUT) is 0 Volt. Thereafter, when the input signal transitions from 0 to 1, the voltage at the output (OUT) is VDD Volts.

From the above, when VDD<VDDM, the switch module 120 disconnects the input (IN) from the output (OUT) and connects the level shifter 110 to the output (OUT). Consequently, the input signal traverses along a path that passes through the level shifter 110. Therefore, a delay between the input and output signals can be attributed to the level shifter 110. On the other hand, when VDD>VDDM, the switch module 120 disconnects the level shifter 110 from the output (OUT) and connects the input (IN) to the output (OUT). Consequently, the input signal traverses along a separate path that bypasses the level shifter 110. Therefore, there may be a less delay between the input and output signals of the semiconductor device 100. For example, a delay between rising edges of the input and output signals of the semiconductor device 100 may be reduced by, e.g., within 10%, 20%, or more, compared to conventional semiconductor devices.

Furthermore, when VDD>VDDM, the VDDM node of the level shifter 110 is disconnected from the cross-coupling transistors (P1, P4) of the level shifter 110. This avoids building up of static current in the level shifter 110 and thus reduces power consumption of the semiconductor device 100.

Figure 4:
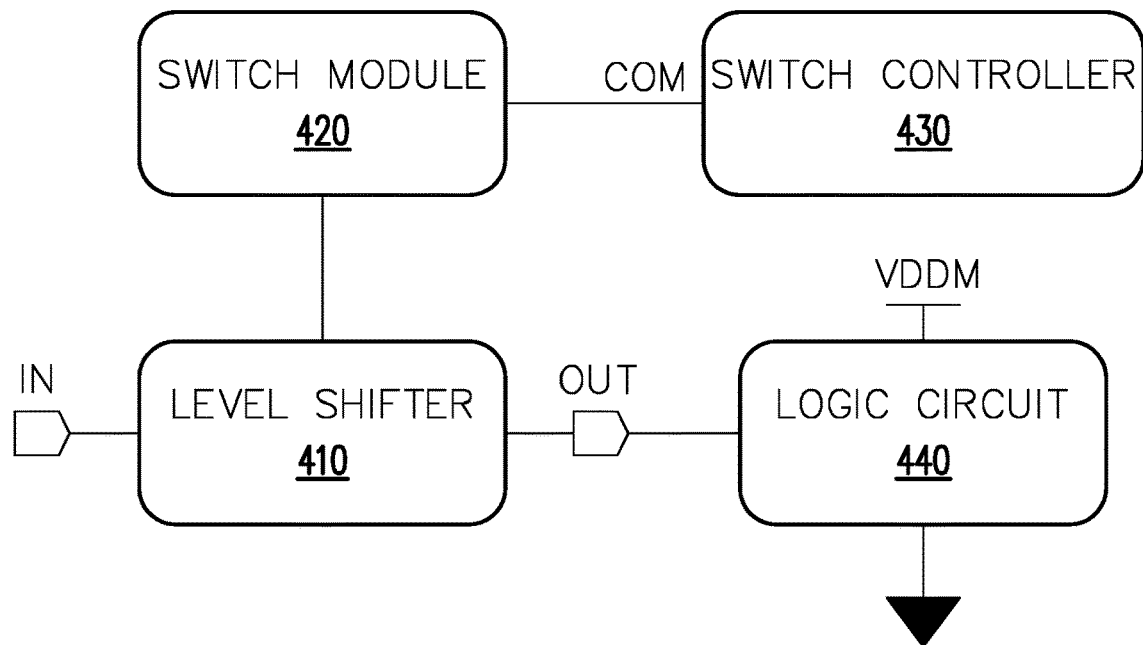
FIG. 4 is a schematic block diagram illustrating another exemplary semiconductor device in accordance with various embodiments of the present disclosure.

FIG. 4 is a schematic block diagram illustrating another exemplary semiconductor device 400 in accordance with some embodiments of the present disclosure. As illustrated in FIG. 4, the semiconductor device 400 includes a level shifter 410, a switch module 420, a switch controller 430, and a logic circuit 440. The level shifter 410 is connected between an input (IN) and an output (OUT) of the semiconductor device 400. The input (IN) is configured to receive an input signal in a first voltage domain. The first voltage domain transitions between a high logic level, which corresponds to a first voltage, e.g., VDD Volts, and a low logic level, e.g., 0 Volt.

The level shifter 410 is configured to shift the input signal from the first voltage (VDD) domain to a second voltage domain. The second voltage domain transitions between a high logic level, which corresponds to a second voltage, e.g., VDDM Volts, and a low logic level, e.g., 0 Volt. The first voltage (VDD) may be higher or lower than the second voltage (VDDM).

The switch controller 430 is configured to receive the voltages (VDD, VDDM) and to determine whether the voltage (VDD) is lower or higher than the voltage (VDDM). When it is determined that the voltage (VDD) is lower than the voltage (VDDM), i.e., VDD<VDDM, the switch controller 430 generates a control signal (COM) that has a low logic level, otherwise, i.e., it is determined that VDD>VDDM, the switch controller 430 generates a control signal (COM) that has a high logic level. Such a correspondence may be reversed in some embodiments. For example, when it is determined that VDD<VDDM, the switch controller 430 generates a control signal (COM) having a high logic level, otherwise, the switch controller 430 generates a control signal (COM) having a low logic level.

In certain embodiments, the switch controller 430 is a portion of a power management circuit of the semiconductor device 400 capable of, for example, managing a power consumption of the semiconductor device 400.

The switch module 420 is responsive to the control signal (COM) for controlling switching activities thereof. For example, when the control signal (COM) is a low logic level, the switch module 420 disconnects a VDD node, which receives the voltage (VDD), from the level shifter 410 and connects a VDDM node, which receives the voltage (VDDM), to the level shifter 410. In this manner, as will be described below, the output (OUT) outputs an output signal in the second voltage (VDDM) domain. On the other hand, when the control signal (COM) is a high logic level, the switch module 420 disconnects the VDDM node from the level shifter 410 and connects the VDD node to the level shifter 410. In this manner, as will be described below, the output (OUT) outputs an output signal in the first voltage (VDD) domain.

The logic circuit 440 is connected to the output (OUT) and is configured to operate in the second voltage (VDDM) domain and to invert the output signal one or more times, depending on the system functionality. Because the construction and operation of the logic circuit 440 are similar to those described hereinabove in connection with the logic circuit 140, a detailed description of the same will be dispensed with herein for the sake of brevity.

In an alternative embodiment, the semiconductor device 400 is dispensed with at least one of the switch controller 430 and the logic circuit 440. In such an alternative embodiment, the at least one of the switch controller 430 and the logic circuit 440 may be connected external to the semiconductor device 400.

Figure 5:
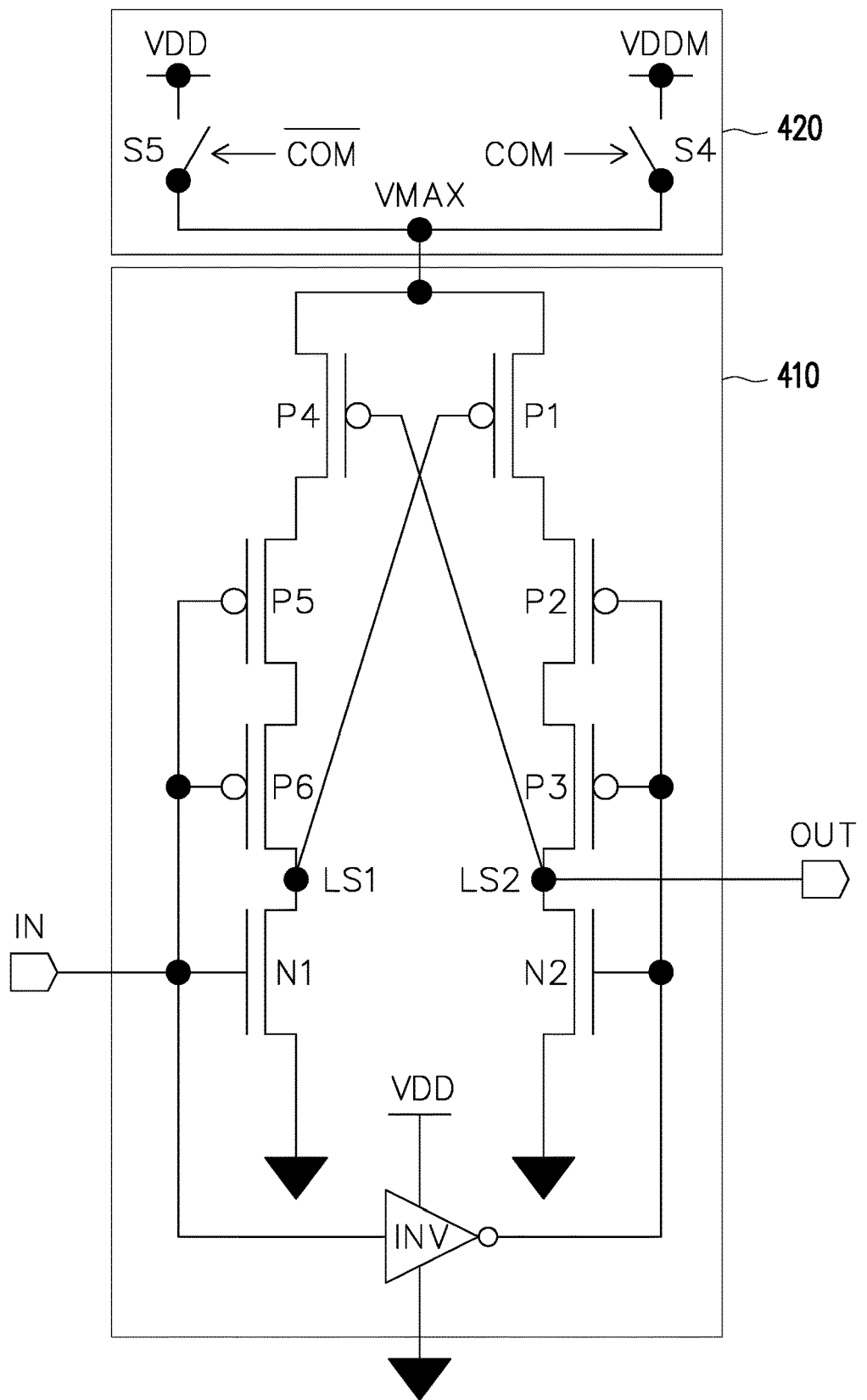
FIG. 5 is a schematic circuit diagram illustrating an exemplary level shifter and an exemplary switch module in accordance with various embodiments of the present disclosure.

Example supporting circuitry for the level shifter 410 and the switch module 420 are depicted in FIG. 5. It is understood that these circuitry are provided by way of example, not by limitation, and other suitable level shifter circuitry and switch module circuitry are within the scope of the present disclosure. FIG. 5 is a schematic circuit diagram illustrating an exemplary level shifter 410 and an exemplary switch module 420 in accordance with various embodiments of the present disclosure. As illustrated in FIG. 5, the level shifter 410 includes an inverter (INV) operating in the first voltage (VDD) domain. The level shifter 410 further includes two pull-down NMOS transistors (N1, N2), two cross-coupling PMOS transistors (P1, P4), and stacking PMOS transistors (P2, P3, P5, P6) between the pull-down NMOS transistors (N1, N2) and the cross-coupling PMOS transistors (P1, P4).

The switch module 420 includes switches (S4, S5) responsive to a control signal (COM) for controlling switching activities thereof, in a manner that will be described below. Although not shown, an inverter is connected between the switch controller 430 and the switch (S5). Therefore, when the control signal (COM) at the switch (S4) is at a high/low logic level, a complement of the control signal (COM), i.e., a low/high logic level, is at the switch (S5) and vice versa.

The switch (S4) connects selectively a VDDM node, which receives the voltage (VDDM), to the cross-coupling PMOS transistors (P1, P4) of the level shifter 410. The switch (S4) has a first switch terminal connected to the VDDM node, a second switch terminal connected to the cross-coupling PMOS transistors (P1, P4) of the level shifter 410, and a third switch terminal configured to receive the control signal (COM).

The switch (S5) connects selectively a VDD node, which receives the voltage (VDD), to the cross-coupling PMOS transistors (P1, P4) of the level shifter 410. The switch (S5) has a first switch terminal connected to the VDD node, a second switch terminal connected to the cross-coupling PMOS transistors (P1, P4) of the level shifter 410, and a third switch terminal configured to receive a complement of the control signal (COM).

In this exemplary embodiment, the switch (S4, S5) is in the form of a PMOS transistor that has a source, a drain, and a gate, each of which serves as a respective one of the first, second, and third switch terminals of the switch (S4, S5). Other configurations for the switch (S4, S5) are used in further embodiments.

In operation, the switch controller 430 receives the voltages (VDD, VDDM) and determines whether the voltage (VDD) is lower or higher than the voltage (VDDM). When it is determined that the voltage VDD is less than the voltage (VDDM), i.e., VDD<VDDM, the switch controller 430 generates a control signal (COM) that has a low logic level, thereby turning ON the switch (S4) and, at substantially the same time, turning OFF the switch (S5). Consequently, a voltage (VMAX) at a VMAX node is substantially equal to the voltage (VDDM). At this time, when the input signal at the input (IN) transitions from a high logic level, i.e., "1", to a low logic level, i.e., "0", the NMOS transistor (N1) remains OFF and the output of the inverter (INV) is a high logic level. The output of the inverter (INV) causes the NMOS transistor N2 to turn ON and as a result, the node (LS2) of the level shifter 410 is pulled down, the output (OUT) is discharged to the ground, and the voltage at the output (OUT) is 0 Volt.

Thereafter, when the input signal transitions 0 to 1, the NMOS transistor (N1) turns ON and the output of the inverter (INV) is a low logic level. This causes the NMOS transistor (N2) to turn OFF and the PMOS transistors (P1-P3) to turn ON. As a result, the node (LS1) of the level shifter 410 is pulled down and the output (OUT) is charged to the voltage (VDDM) through the PMOS transistors (P1-P3).

On the other hand, when it is determined that VDD>VDDM, the switch controller 430 generates a control signal (COM) that has a high logic level, thereby turning OFF the switch (S4) and, at substantially the same time, turning ON the switch (S5). Consequently, the voltage (VMAX) at the VMAX node is substantially equal to the voltage (VDD). At this time, when the input signal transitions from 1 to 0, the NMOS transistor (N1) remains OFF and the output of the inverter (INV) is a high logic level. The output of the inverter (INV) causes the NMOS transistor N2 to turn ON and as a result, the node (LS2) of the level shifter 410 is pulled down, the output (OUT) is discharged to the ground, and the voltage at the output (OUT) is 0 Volt.

Thereafter, when the input signal transitions from 0 to 1, the NMOS transistor (N1) turns ON and the output of the inverter (INV) is a low logic level. This causes the NMOS transistor (N2) to turn OFF and the PMOS transistors (P1-P3) to turn ON. As a result, the node (LS1) of the level shifter 410 is pulled down and the output (OUT) is charged to the voltage (VDD) through PMOS transistors (P1-P3).

From the above, when VDD<VDDM, the switch module 420 disconnects the VDD node from the level shifter 410 and connects the VDDM node to the level shifter 410 and, when VDD>VDDM, the switch module 420 disconnects the VDDM node from the level shifter and connects the VDD node to the level shifter. Consequently, the level shifter 410 is consistently powered by the voltage (VMAX), which is substantially equal to the higher one of the voltages (VDD, VDDM). This results in high gate-source voltages ($V_{GS}$) of the transistors (P1-P3) of the level shifter 410 and thus in more charging current flowing through the transistors (P1-P3) of the level shifter 410. Therefore, there may be a less delay between the input and output signals of the semiconductor device 400. For example, a delay between rising edges of the input and output signals of the semiconductor device 400 may be reduced by, e.g., 10%, 20%, or more, compared to conventional semiconductor devices.

Figure 6:
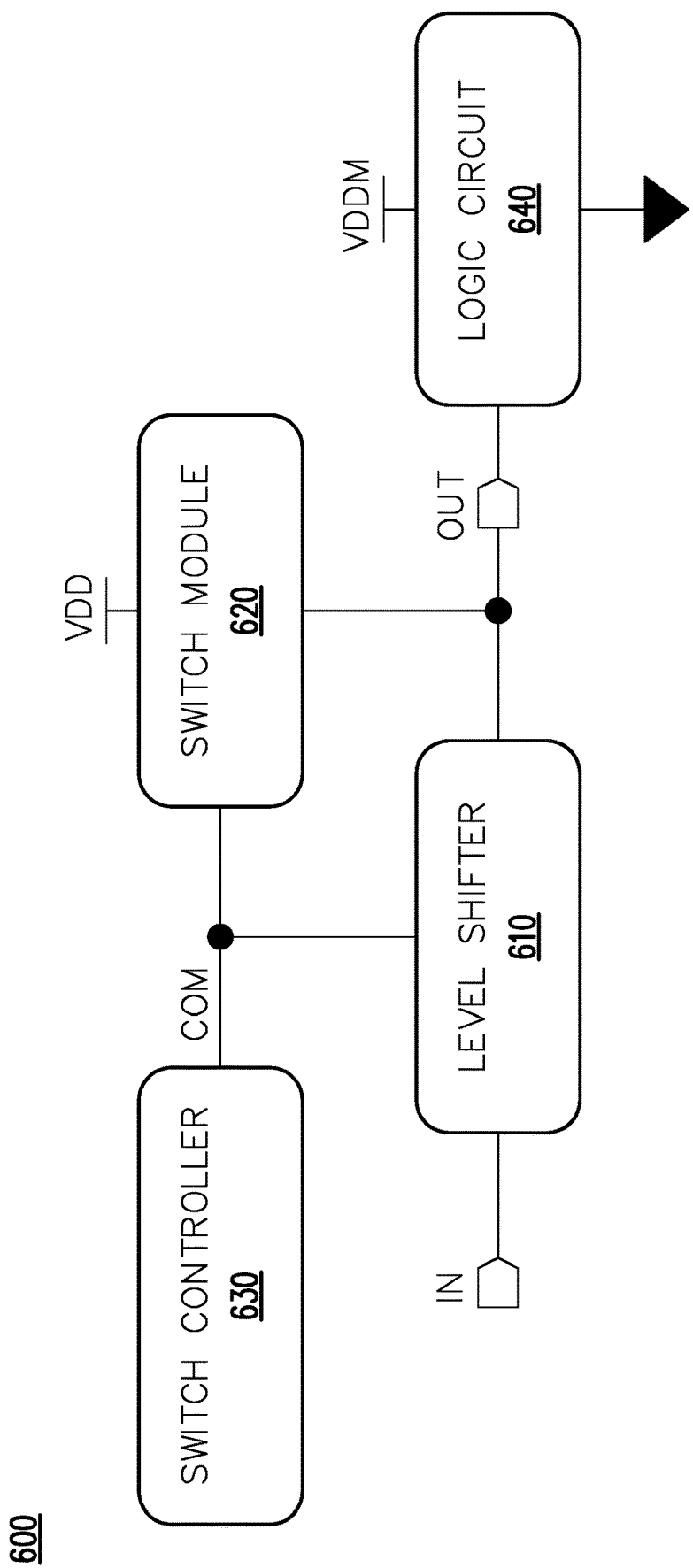
FIG. 6 is a schematic block diagram illustrating another exemplary semiconductor device in accordance with various embodiments of the present disclosure.

FIG. 6 is a schematic block diagram illustrating another exemplary semiconductor device 600 in accordance with some embodiments of the present disclosure. As illustrated in FIG. 6, the semiconductor device 600 includes a level shifter 610, a switch module 620, a switch controller 630, and a logic circuit 640. The level shifter 610 is connected between an input (IN) and an output (OUT) of the semiconductor device 600. The input (IN) is configured to receive an input signal in a first voltage domain. The first voltage domain transitions between a high logic level, which corresponds to a first voltage, e.g., VDD Volts, and a low logic level, e.g., 0 Volt.

The level shifter 610 is configured to shift the input signal from the first voltage (VDD) domain to a second voltage domain. The second voltage domain transitions between a high logic level, which corresponds to a second voltage, e.g., VDDM Volts, and a low logic level, e.g., 0 Volt. The first voltage (VDD) may be higher or lower than the second voltage (VDDM).

The switch controller 630 is configured to receive the voltages (VDD, VDDM) and to determine whether the voltage (VDD) is lower or higher than the voltage (VDDM). When it is determined that the voltage (VDD) is lower than the voltage (VDDM), i.e., VDD<VDDM, the switch controller 630 generates a control signal (COM) that has a low logic level, otherwise, i.e., it is determined that VDD>VDDM, the switch controller 630 generates a control signal (COM) that has a high logic level. Such a correspondence may be reversed in some embodiments. For example, when it is determined that VDD<VDDM, the switch controller 630 generates a control signal (COM) having a high logic level, otherwise, the switch controller 630 generates a control signal (COM) having a low logic level.

In certain embodiments, the switch controller 630 is a portion of a power management circuit of the semiconductor device 600 capable of, for example, managing a power consumption of the semiconductor device 600.

The switch module 620 is responsive to the control signal (COM) for controlling switching activities thereof. For example, when the control signal (COM) is a low logic level, the switch module 620 disconnects a VDD node, which receives the voltage (VDD), from the output (OUT). In this manner, as will be described below, the output (OUT) outputs an output signal in the second voltage (VDDM) domain. On the other hand, when the control signal (COM) is a high logic level, the switch module 420 connects the VDD node to the output (OUT). In this manner, as will be described below, the output (OUT) outputs an output signal in the first voltage (VDD) domain.

The logic circuit 640 is connected to the output (OUT) and is configured to operate in the second voltage (VDDM) domain and to invert the output signal one or more times, depending on the system functionality. Because the construction and operation of the logic circuit 640 are similar to those described hereinabove in connection with the logic circuit 140 and the logic circuit 440, a detailed description of the same will be dispensed with herein for the sake of brevity.

In an alternative embodiment, the semiconductor device 600 is dispensed with at least one of the switch controller 630 and the logic circuit 640. In such an alternative embodiment, the at least one of the switch controller 630 and the logic circuit 640 may be connected external to the semiconductor device 600.

Figure 7:
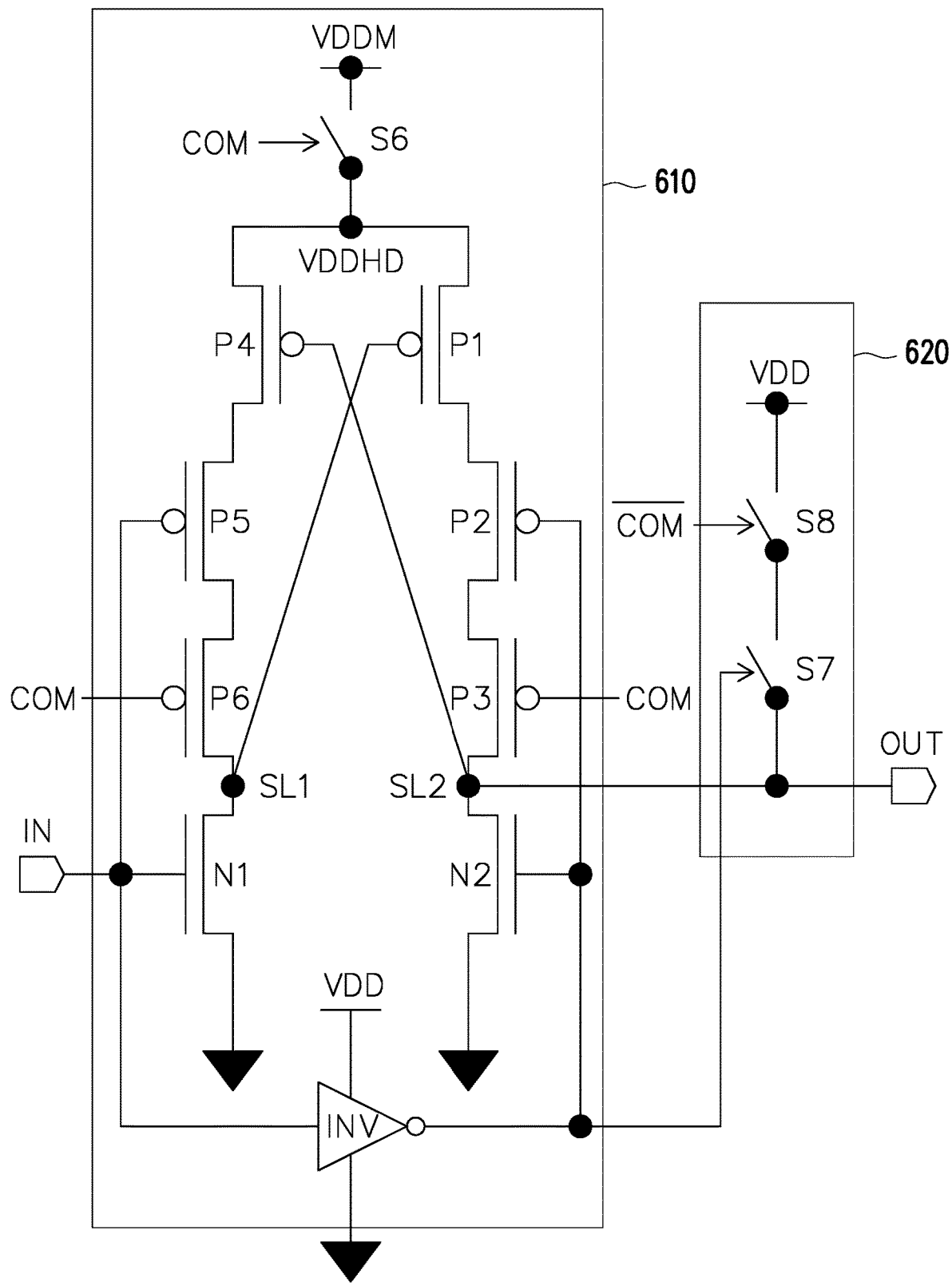
FIG. 7 is a schematic block diagram illustrating another exemplary semiconductor device in accordance with various embodiments of the present disclosure.

Example supporting circuitry for the level shifter 610 and the switch module 620 are depicted in FIG. 7. It is understood that these circuitry are provided by way of example, not by limitation, and other suitable level shifter circuitry and switch module circuitry are within the scope of the present disclosure. FIG. 7 is a schematic circuit diagram illustrating an exemplary level shifter 610 and an exemplary switch module 620 in accordance with various embodiments of the present disclosure. As illustrated in FIG. 7, the level shifter 610 includes an inverter (INV) operating in the first voltage (VDD) domain. The level shifter 610 further includes two pull-down NMOS transistors (N1, N2), two cross-coupling PMOS transistors (P1, P4), and stacking PMOS transistors (P2, P3, P5, P6) between the pull-down NMOS transistors (N1, N2) and cross-coupling PMOS transistors (P1, P4).

The level shifter 610 further includes a switch (S6) that connects selectively a VDDM node, which receives the voltage (VDDM), to the cross-coupling PMOS transistors (P1, P4) thereof. The switch (S6) has a first switch terminal connected to the VDDM node, a second switch terminal connected to the cross-coupling PMOS transistors (P1, P4) of the level shifter 610, and a third switch terminal configured to receive the control signal (COM). In this exemplary embodiment, the switch (S6) is in the form of a PMOS transistor that has a source, a drain, and a gate, each of which serves as a respective one of the first, second, and third switch terminals of the switch (S6). Other configurations for the switch (S6) are used in further embodiments.

One or more of the transistors (N1, N2, P1-P6) of the level shifter 610 may be configured to receive the control signal (COM). In this exemplary embodiment, as illustrated in FIG. 7, each of the PMOS transistors (P3, P6) has a gate configured to receive the control signal (COM).

The switch module 620 includes switches (S7, S8). The switch (S7) has a first switch terminal, a second switch terminal connected to the output (OUT), and a third switch terminal connected to the inverter (INV). The second switch (S8) has a first switch terminal connected to a VDD node, which receives the voltage (VDD), a second switch terminal connected to the first switch terminal of the switch (S7), and a third switch terminal configured to receive a complement of the control signal (COM). In this exemplary embodiment, the switch (S7, S8) is in the form of a PMOS transistor that has a source, a drain, and a gate, each of which serves as a respective one of the first, second, and third switch terminals thereof. Other configurations for the switch (S7, S8) are used in further embodiments.

In operation, the switch controller 630 receives the voltages (VDD, VDDM) and determines whether the voltage (VDD) is lower or higher than the domain voltage (VDDM). When it is determined that the voltage (VDD) is less than the voltage (VDDM), i.e., VDD<VDDM, the switch controller 630 generates a control signal (COM) that has a low logic level, thereby turning OFF the switch (S8) and, at substantially the same time, turning ON the PMOS transistors (P3, P6) and the switch (S6). At this time, when the input signal at the input (IN) transitions from a high logic level, i.e., "1", to a low logic level, i.e., "0", the NMOS transistor (N1) remains OFF and the output of the inverter (INV) is a high logic level. The output of the inverter (INV) causes the NMOS transistor (N2) to turn ON and as a result, the node (LS2) of the level shifter 610 is pulled down, the output (OUT) is discharged to the ground, and the voltage at the output (OUT) is 0 Volt.

Thereafter, when the input signal transitions 0 to 1, the NMOS transistor (N1) turns ON and the output of the inverter (INV) is a low logic level. This causes the NMOS transistor (N2) to turn OFF and the PMOS transistors (P1, P2) to turn ON. As a result, the node (LS1) of the level shifter 610 is pulled down and the output (OUT) is charged to the voltage (VDDM) through PMOS transistors (P1-P3).

On the other hand, when it is determined that VDD>VDDM, the switch controller 630 generates a control signal (COM) that has a high logic level, thereby turning ON the switch (S8) and, at substantially the same time, turning OFF the transistors (P3, P6) and the switch (S6). At this time, when the input signal at the input (IN) transitions from 1 to 0, the NMOS transistor (N1) remains OFF and the output of the inverter (INV) is a high logic level. The output of the inverter (INV) causes the NMOS transistor N2 to turn ON and the switch (S7) to turn OFF and as a result, the node (LS2) of the level shifter 410 is pulled down, the output (OUT) is discharged to the ground, and the voltage at the output (OUT) is 0 Volt.

Thereafter, when the input signal transitions from 0 to 1, the output of the inverter (INV) is a low logic level. This causes the NMOS transistor (N2) to turn OFF and the switch (S7) to turn ON. As a result, the voltage at the output (OUT) is VDD Volts.

From the above, when VDD<VDDM and during the 0 to 1 transition of the input signal, the input signal traverses along a path that passes through the PMOS transistors (P1-P3) of the level shifter 610. Therefore, a delay between rising edges of the input and output signals may be attributed to the PMOS transistors (P1-P3) of the level shifter 610. On the other hand, when VDD>VDDM and during the 0 to 1 transition of the input signal, the switch module 620 connects the VDD node to the output (OUT). Consequently, the input signal traverses along a separate path that bypasses the PMOS transistors (P1-P3) of the level shifter 610. Therefore, there may be a less delay between the input and output signals of the semiconductor device 600. For example, a delay between rising edges of the input and output signals of the semiconductor device 600 may be reduced by, e.g., within 10%, 20%, or more, compared to conventional semiconductor devices.

Furthermore, when VDD>VDDM, the VDDM node of the level shifter 610 is disconnected from the cross-coupling transistors (P1, P4) of the level shifter 610. This avoids building up of static current in the level shifter 610 and thus reduces power consumption of the semiconductor device 600.

Figure 8:
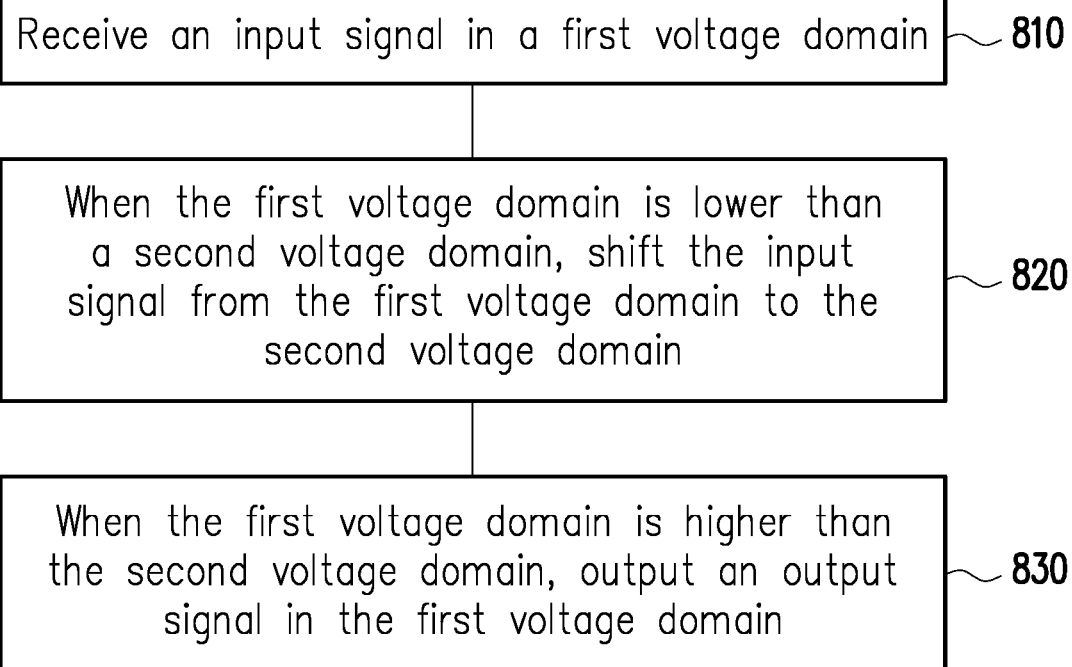
FIG. 8 is a flow chart illustrating an exemplary method of mitigating a delay between input and output signals of a semiconductor device in accordance with various embodiments of the present disclosure.

FIG. 8 is a flow chart illustrating an exemplary method 800 mitigating a delay between input and output signals of a semiconductor device in accordance with various embodiments of the present disclosure. Method 800 will now be described with further reference to FIGS. 2, 5, and 7 for ease of understanding. It is understood that method 800 is applicable to structures other than those of FIGS. 2, 5, and 7. Further, it is understood that additional operations can be provided before, during, and after method 800, and some of the operations described below can be replaced or eliminated, in an alternative embodiment of method 800.

In operation 810, an input signal in a first voltage domain, which has a high logic level that corresponds to a first voltage, is received. For example, the input (IN) receives an input signal in a first voltage (VDD) domain, which has a high logic level that corresponds to a first voltage (VDD), as described with respect to FIGS. 2, 5, and 7.

In operation 820, when the first voltage is lower than a second voltage, the input signal is shifted from the first voltage domain to a second voltage domain, which has a high logic level that corresponds to the second voltage. For example, when the first voltage (VDD) is lower than the second voltage (VDDM), the level shifter 110, 410, 610 shifts the input signal from first voltage (VDD) domain to the second voltage (VDDM) domain, which has a high logic level that corresponds to the second voltage (VDDM), as described with respect to FIGS. 2, 5, and 7.

In operation 830, when the first voltage is higher than the second voltage, an output signal in the first voltage domain is outputted. For example, when the first voltage (VDD) is higher than the second voltage (VDDM), the output (OUT) outputs an output signal in the first voltage (VDD) domain, as described with respect to FIGS. 2, 5, and 7. Therefore, there may be a less delay between the input and output signals of the semiconductor device of the present disclosure. For example, a delay between rising edges of the input and output signals of the semiconductor device of the present disclosure may be reduced by, e.g., 10%, 20%, or more, compared to conventional semiconductor devices.

In an embodiment, a semiconductor device comprises an input, a level shifter, an output, and a switch module. The input is configured to receive an input signal in a first voltage domain. The level shifter is connected to the input and is configured to shift the input signal from the first voltage domain to a second voltage domain. The switch module is configured to connect one of the input and the level shifter to the output.

In another embodiment, a semiconductor device comprises a level shifter and a switch module. The switch module includes a VDD node configured to receive a first voltage and a VDDM node configured to receive a second voltage. The switch module is configured to connect one of the VDD node and the VDDM node to the level shifter.

In another embodiment, a method of mitigating a delay between input and output signals of a semiconductor device comprises: receiving an input signal in a first voltage domain, which has a high logic level that corresponds to a first voltage; when the first voltage is lower than a second voltage, shifting the input signal from the first voltage domain to a second voltage domain, which has a high logic level that corresponds to the second voltage; and when the first voltage is higher than the second voltage, outputting an output signal in the first voltage domain.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a level shifter;
   an output connected to the level shifter and configured to provide an output signal in a first voltage domain or a second voltage domain; and
   a switch module configured to connect a VDD node to the output when the first voltage domain is higher than the second voltage domain.

2. The semiconductor device of claim 1, wherein the switch module includes a first switch connected to the output.

3. The semiconductor device of claim 2, further comprising an input connected to the level shifter and configured to receive an input signal in the first voltage domain and the first switch is configured to be controlled by the input signal.

4. The semiconductor device of claim 2, further comprising an input connected to the level shifter and configured to receive an input signal in the first voltage domain, wherein the level shifter includes an inverter between the input and the first switch.

5. The semiconductor device of claim 2, wherein the switch module further includes a second switch between the VDD node and the first switch.

6. The semiconductor device of claim 1, further comprising a switch controller configured to control switching operation of the switch module.

7. The semiconductor device of claim 1, further comprising a VDDM node and a switch configured to disconnect a VDDM mode from the level shifter when the first voltage domain is higher than the second voltage domain and to connect the VDDM node to the level shifter when the first voltage domain is lower than the second voltage domain.

8. The semiconductor device of claim 7, further comprising a switch controller configured to control the switch.

9. The semiconductor device of claim 1, further comprising a logic circuit connected to the output and configured to invert the output signal one or more times.

10. The semiconductor device of claim 1, wherein the level shifter includes:
a plurality of cross-coupling transistors;
a plurality of pull-down transistors; and
a plurality of stacking transistors connected between the cross-coupling transistors and the pull-down transistors.

11. The semiconductor device of claim 1, wherein the level shifter includes an inverter connected to the VDD node.

12. The semiconductor device of claim 11, wherein the level shifter further includes a pair of pull-down transistors and the inverter has an input terminal connected to a gate of one of the pull-down transistors and an output terminal connected to a gate of the other of the pull-down transistors.

13. The semiconductor device of claim 11, wherein the level shifter further includes a plurality of stacking transistors and the inverter has an input terminal connected to a gate of the stacking transistors and an output terminal connected to another gate of the stacking transistors.

14. The semiconductor device of claim 11, wherein the level shifter further includes a pull-down transistor and a stacking transistor and the inverter has an input terminal connected to a gate of the pull-down transistor and an output terminal connected to a gate of the stacking transistors.

15. The semiconductor device of claim 11, wherein the level shifter further includes a plurality of stacking transistors and a pull-down transistor and the inverter has an input terminal connected to a gate of the stacking transistors and an output terminal connected to a gate of the pull-down transistor.

16. The semiconductor device of claim 1, wherein the level shifter includes a plurality of cross-coupling transistors connected to a VDDHD node and a switch between a VDDM node and the VDDHD node.

17. A method comprising:
receiving, at an input, an input signal in a first voltage domain that has a first voltage;
providing, at an output, an output signal in the first voltage domain or a second voltage domain that has a second voltage; and
when the first voltage domain is higher than the second voltage domain, permitting the output to receive the first voltage from a VDD node and inhibiting a level shifter from receiving the second voltage from a VDDM node.

18. The method of claim 17, further comprising, when the first voltage is lower than the second voltage, inhibiting the output from receiving the first voltage from the VDD node and permitting the level shifter to receive the second voltage from the VDDM node.

19. A semiconductor device comprising:
a switch controller configured to determine whether a first voltage is higher than a second voltage and to generate a control signal when it is determined that the first voltage is higher than the second voltage; and
a switch module configured to connect a VDD node to an output connected to a level shifter and to disconnect a VDDM node from the level shifter in response to the control signal.

20. The semiconductor device of claim 19, further comprising the VDD node, the VDDM node, and the level shifter.

* * * * *